United States Patent [19]

Longden

[11] Patent Number: 4,687,622
[45] Date of Patent: Aug. 18, 1987

[54] NUCLEAR EVENT DETECTOR

[75] Inventor: Larry L. Longden, San Diego, Calif.

[73] Assignee: IRT Corporation, San Diego, Calif.

[21] Appl. No.: 792,572

[22] Filed: Oct. 29, 1985

[51] Int. Cl.$^4$ .............................................. G21C 17/00
[52] U.S. Cl. ..................................... 376/254; 376/255
[58] Field of Search ................. 250/336.1; 371/38, 68; 376/254, 255; 364/200; 375/17

[56] References Cited

U.S. PATENT DOCUMENTS

| | | | |
|---|---|---|---|
| 3,281,811 | 10/1966 | Cotterman et al. | 250/336.1 |
| 3,432,829 | 3/1969 | Hewitt et al. | 250/336.1 |
| 4,031,374 | 6/1977 | Groudan et al. | 371/38 |
| 4,199,810 | 4/1980 | Gunckel, II et al. | 371/68 |
| 4,208,692 | 6/1980 | Rohr | 361/87 |
| 4,219,804 | 8/1980 | Weischedel | 340/600 |
| 4,266,145 | 5/1981 | Amacher et al. | 361/89 |
| 4,280,221 | 7/1981 | Chun et al. | 375/17 |
| 4,464,752 | 8/1984 | Schroeder et al. | 371/38 |
| 4,591,976 | 5/1986 | Webber et al. | 364/200 |

OTHER PUBLICATIONS

Analysis and Test Report for the RAD Hard Card, IRT Corporation, Aug. 2, 1977.

Primary Examiner—Salvatore Cangialosi
Attorney, Agent, or Firm—Fitch, Even, Tabin & Flannery

[57] ABSTRACT

A nuclear event detector for sensing the occurrence of an ionizing radiation pulse and providing switched outputs in response to the sensing. The detector includes an ionizing radiation sensor which provides a sensor output signal when an ionizing radiation pulse incident thereon exceeds a predetermined threshold level. The detector further includes a pulse timer circuit which is responsive to the sensor output signal for providing a timing signal pulse of a predetermined duration. The detector also includes a latch circuit triggered by the output of the timer circuit which provides a flag signal indicating that an ionizing radiation pulse has been sensed. The latch circuit, timer circuit and sensor are part of a hybrid microcircuit and are disposed in a sealed enclosure with connectors extending from inside the enclosure to outside the enclosure. A first external connector is adapted for connection to a first electrical component for setting the threshold level. A second external connector is adapted for connection to a second electrical component for determining the duration of the timing signal pulse. When the threshold level is preset by the manufacturer, only connection to a second electrical component for determining the duration of the timer pulse is required. The detector includes test circuitry built inside the sealed package permitting all components of the detector to be operated under test.

30 Claims, 14 Drawing Figures

NUCLEAR EVENT DETECTOR

The present invention relates to radiation sensors and, more specifically, to a nuclear even detector which senses a pulse of ionizing radiation and rapidly switches output signals in response to the sensing and, still more specifically, to such an event detector which incorporates hybrid microcircuitry so that it can be contained in a small sealed package for universal application, with its sensing threshold and output signal duration adjustable by the values of components disposed outside the sealed package and with a preset sensing threshold determined by values of components inside the sealed package.

BACKGROUND OF THE INVENTION

The detonation of a nuclear weapon produces radiating outputs which completely destroy all things in a zone near the center of the detonation and radiate outwardly therefrom with lesser destructive effect. The extent of the destruction zone and the destruction outside the zone are highly dependent upon weapon yield. Among these outputs which radiate from the point of detonation are x-rays, prompt and delayed gamma rays, neutrons, heat and mechanical shock. The first output to reach a remote location, which may be, for example, several miles outside the destruction zone, is a pulse of ionizing radiation which has the potential of damaging or destroying electronic components. Critical command, communication, control and intelligence systems must be able to function after the initial radiation pulse dissipates. While the destruction of electronic devices due to ionizing radiation is not as visually apparent as destruction by intense heat and air blast, such destruction may be just as complete and must be circumvented.

Semiconductor devices are formed of p-type material, having excess holes, and n-type material, having excess electrons. When p-type material and n-type material are brought together, a junction is formed with a depletion region about the junction. In the case of a diode, forward biasing of the device narrows the depletion region, causing the diode to act as a closed switch. On the other hand, reverse biasing of the diode results in widening of the depletion region, causing the diode to function as an open switch. Ionizing radiation such as gamma radiation generates excess electron-hole pairs within all semiconductor materials, resulting in transient leakage currents, commonly called photocurrents, that appear across reverse-biased semiconductor junctions. The high, transient photocurrents interfere with normal circuit operations and often result in permanent damage to electronic equipment. Interference with normal circuit operations without permanent damage to the device is referred to as upset, whereas permanent damage occasioned by dissipation of energy in high, transient photocurrents over a period of time is referred to as burnout.

The concept of circumvention encompasses all elements of design necessary to prevent upset or burnout resulting from ionizing radiation pulses. When circumvention is incorporated as part of a system hardening approach, both hardware and software requirements can be minimized. For example, consider a system that contains critical data that cannot be lost without dire consequences. By using circumvention, only the specific circuits containing the critical data must be hardened against upset. An ionizing pulse can be detected and used to trigger circumvention hardware to provide protection. If circumvention is not employed, the hardware must all be designed using circuit topologies and components that will resist upset at the maximum ionizing dose rate. The circumvention hardware can control the interfaces between upset-hardened circuits and non-upset-hardened circuits to prevent transients from the latter from entering the upset-hardened circuits. The use of circumvention thus reduces or eliminates the upset-hardening requirements for the majority of the system components thereby minimizing the cost of nuclear hardening of the overall system.

The heart of any circumvention system is a nuclear event detector which functions to sense ionizing radiation and quickly triggers protection circuitry. For a complex system, the sequence of events starts with the detection of the ionizing pulse. The detection signal then triggers a timer which controls the onset and pulsewidth of a circumvention signal. The pulsewidth of the circumvention signal must be longer than the longest hardware recovery time in the system, because the termination of this signal is used to initiate recovery, at which time the hardware must be functional. Any delay through the sensing and pulse timing network must be minimized because the hardware which prevents upset will be driven by this signal. At the initial edge of this signal, the upset prevention circuitry will be triggered. There are four basic functions that are to be inhibited at this point. The writing into hardened memory is halted, data processing is stopped, the over/under voltage and over-current shutdown circuitry for any power supply that must operate through the critical period is disabled and other critical outputs are prevented from upsetting.

At the initial edge of the output signal, burnout prevention circuitry can also be triggered. Because burnout requires a longer time to occur, this circuitry need not react as rapidly as the upset prevention circuitry. Burnout prevention hardware normally consists of power supply crowbars, other power supply switches and signal clamps to prevent the generation of damaging photocurrents.

After the initial signal edge, all of the circumvention hardware has been triggered and is performing its function. The most time-consuming function during this period is the crowbarring of power supplies due to the finite time required to discharge storage capacitors. At the terminating edge of the circumvention signal, all of the circumvention hardware is disabled, and both hardware and software recovery are initiated. During this restart, hardware recovery consists primarily of restarting any power supplies that were shut down and/or crowbarred. Software recovery consists of evaluating data integrity, initiating error correction algorithms, initializing registers and/or discrete outputs and restarting processors.

It is common for military systems, such as air launched cruise missiles, to include nuclear event detectors which are designed to provide an output signal in the form of a square wave of predetermined duration in response to sensing a nuclear event. One prior art nuclear event detector includes a sensing circuit incorporating a PIN diode which functions as a solid state ionization chamber. The sensor circuit provides an output which is amplified and used to trigger a timer circuit. This prior art nuclear event detector, which is formed of discrete components mounted on a circuit board, has to be custom designed for each application. Electrical components for setting the threshold level of the sensor circuit and the duration of timer pulse are also mounted on the circuit board. The resulting relatively large custom circuit board design is not conducive to pretesting. Accordingly, the prior art nuclear event detector is required to be tested after it is incorporated into the military system it is custom designed to protect. While this prior art detector has provided satisfactory nuclear hardness in specific applications, an increase in hardness is desirable for universal application.

SUMMARY OF THE INVENTION

Among the several aspects and features of the present invention may be noted the provision of an improved universal nuclear event detector including hybrid microcircuitry allowing the detector to be in a sealed, dual-in-line package so that it can be simply plugged unobtrusively into the system to be protected. The electrical components which determine the sensor threshold level and timer pulse duration are external to the package. These are the only components that need be selected to fit the detector to a particular application and this can be done by relatively unskilled personnel by merely referring to a calibration table or graph. The sensor threshold level may be preset by adjusting component values inside the package. The sealed package can be pretested and certified at the manufacturing facility, thereby precluding the need for expensive testing after the nuclear event detector has been incorporated into the system to be protected. A preferred embodiment of the detector of the present invention includes test circuitry built inside the sealed package permitting all components of the detector to be operated under test. Also included within the sealed package is a latch circuit which provides a flag signal indicating that a nuclear event has occurred. This flag signal remains until the latch circuit is reset, unlike the timer signal itself which automatically switches states after a predetermined time to permit reactivation of the hardened circuitry in the protected system. The detector of the present invention has universal application, has increased nuclear hardness, is reliable in operation, has long service life and is relatively easy and economical to manufacture. Other aspects and features of the present invention will be in part apparent and in part pointed out specifically in the following specification and accompanying claims and drawings.

Briefly, the detector of the present invention includes an ionizing radiation sensor which provides a sensor output when an ionizing radiation pulse exceeds a predetermined threshold level. The detector also includes a pulse timer circuit for providing a pulse of a predetermined duration which timer circuit is triggered by the output of the sensor. The detector also includes a latch circuit which provides a flag signal indicating that a nuclear event has occurred which latch circuit is triggered by the output of the timer circuit. The latch circuit, timer circuit and sensor are part of a hybrid microcircuit which is disposed in a sealed enclosure. The detector also includes connectors extending outside the enclosure. A first connector means is for connection to a first electrical component for setting the threshold level. A second connector means is for connection to a second electrical component for determining the duration of timer pulse. The detector can thereby be made relatively small and have general application as the threshold level and pulse duration can be set by the selection of values of the two electrical components external to the sealed enclosure. When the threshold level is preset by the manufacturer at the desired level, only connection to a second electrical component for determining the duration of the timer pulse is required.

BRIEF DESCRIPTION OF THE DRAWINGS

Corresponding reference characters indicate corresponding components throughout the several views of the drawings.

DESCRIPTION OF THE PREFERRED EMBODIMENTS

Figure 2:
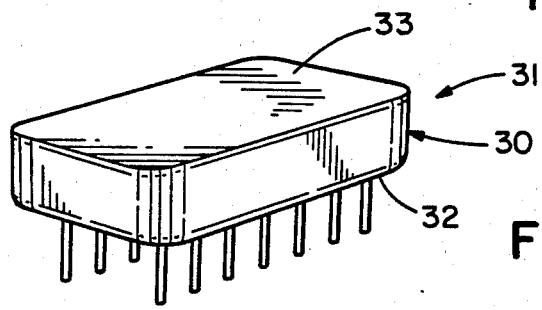
FIG. 2 is an isometric representation of a sealed dual-in-line package housing a nuclear event detector embodying various features of the present invention.
Figure 3:
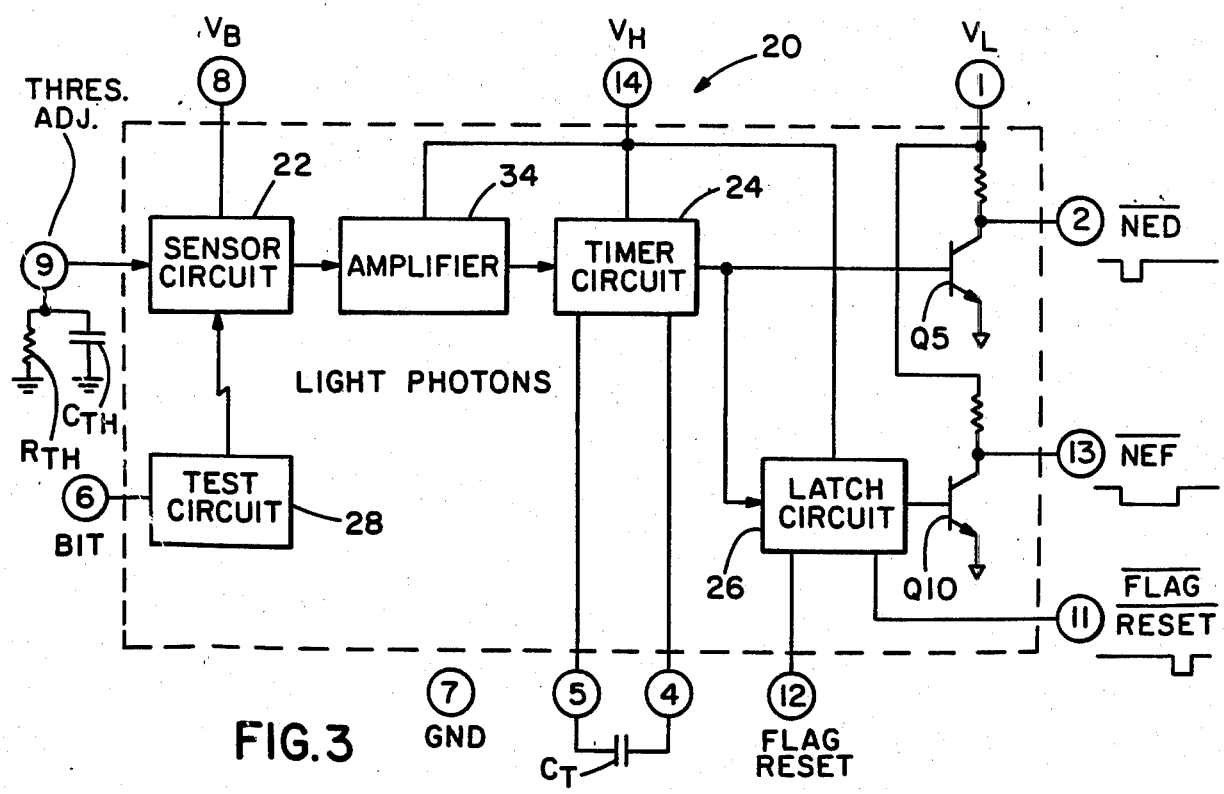
FIG. 3 is a block diagram of the nuclear event detector shown in FIG. 2 illustrating various pin connections and depicting components external to the package for setting the sensing circuit threshold level and the duration of the timer pulse.

Referring now to the drawings, a nuclear event detector 20 embodying various features of the present invention is shown in block form in FIG. 3. The nuclear event detector 20 includes a sensor circuit 22 for detecting an ionizing radiation pulse exceeding a predetermined threshold level. The detector also includes a timer circuit 24 which is responsive to the output of the sensor circuit 22 to provide a timing pulse of predetermined duration. Also included in the detector 20 are a latch circuit 26 which until reset indicates that a nuclear event has occurred and a test circuit 28 which is usable to exercise all of the components of the detector. The detector 20 is manufactured as a hybrid microcircuit encapsulated in a sealed housing 30 in the form of a dual-in-line plug-in package 31 as shown in FIG. 2. The housing 30 includes a base 32 through which a plurality of connecting pins extend, and a cover 33 which is sealed to the base. The use of hybrid microcircuitry permits the package 31 to be of very small size for universal application. More specifically, the package 31 has a length of less than 0.8 inch and a width of less than 0.5 inch. The lines of pins are 0.3 inch apart. The housing 30 is less than 0.15 inch thick and the pins extend from the housing about 0.13 inch.

Figure 1:
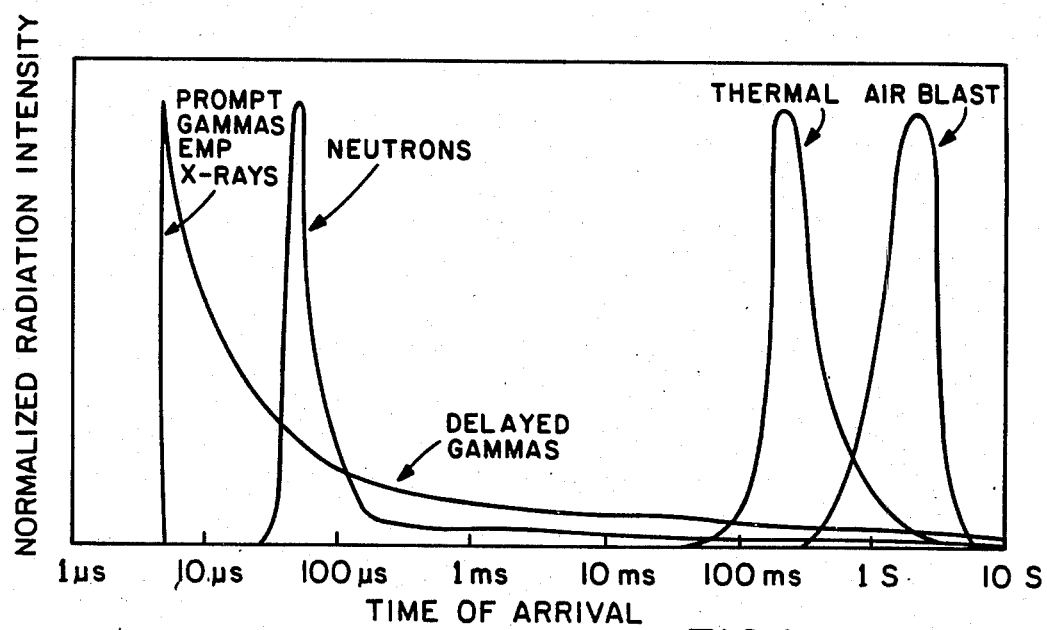
FIG. 1 is a graphic representation of the normalized intensity of various outputs of a nuclear detonation plotted against time of arrival at a typical location remote from the detonation.

Referring to FIG. 1, the outputs which radiate from the detonation of a nuclear weapon are shown at arrival times at a typical distance, for example, several miles, from the destruction zone centered about the detonation. The first outputs to arrive are prompt gamma rays, x-rays and an electromagnetic pulse, which travel at the speed of light. Delayed gamma radiation and neutron radiation follow, with heat and mechanical shock the last to reach the location. The sensor circuit 22 functions to detect the ionizing radiation pulse and to provide a sensor output which the pulse timer circuit 24 uses to provide a quickly switched output, a typical switching time from the sensing of the ionizing pulse to the changing of output level of the timer circuit being about 10 nanoseconds.

As shown in FIG. 3, at pin 2, a nuclear event detection signal (NED) is provided which goes from a high logic state to a low logic state for a predetermined duration, after which time it returns to the high logic state. It will be appreciated that upset of the electronic semiconductor circuitry in a particular military system does not occur instantaneously, as it takes time for the excessive electron-hole pairs to be collected within the semiconductor devices. It takes an even longer time for burnout to occur because heat must be generated and reach a certain level for permanent damage to the devices. The nuclear event detector 20 functions to provide the nuclear event detector signal quickly to switch other components to safe operating modes. Typical protection operations include disabling of write operations for a hardened memory, the halting of central processing unit operations in a computer and the control of power supplies.

Referring to FIG. 3, the nuclear event detector also includes an amplifier 34 for amplifying the output of the sensor circuit and output transistor buffers Q5 and Q10 which are, respectively, for the output of the pulse timer circuit 24 and the output of the logic latch circuit 26. Besides the pin 2 of the detector package 31, other connector pins include pin 1 to which a load voltage ($V_L$) is applied, pin 8 to which a bias voltage ($V_B$) for the sensor circuit 22 is applied, and pin 14 to which a voltage ($V_H$) for the hybrid microcircuit is applied. Pin 6 is used for application of a built-in-test (BIT) voltage to initiate operation of the test circuit 28. Pin 7 is grounded, and pin 13 provides a nuclear event flag (NEF) signal in the form of a low logic signal which remains low until such time as the latch circuit 26 is reset. The latch circuit can be reset by applying a low logic level on pin 11 or a high logic level on pin 12. Pin 9 is a connector from which an electrical component, which may be either a capacitor $C_{TH}$ or a resistor $R_{TH}$, is connected to ground to set the threshold level of the sensor circuit 22. A timing capacitor $C_T$ is connected between pins 4 and 5 to control the pulsewidth of the pulse timer circuit output.

Figure 4:
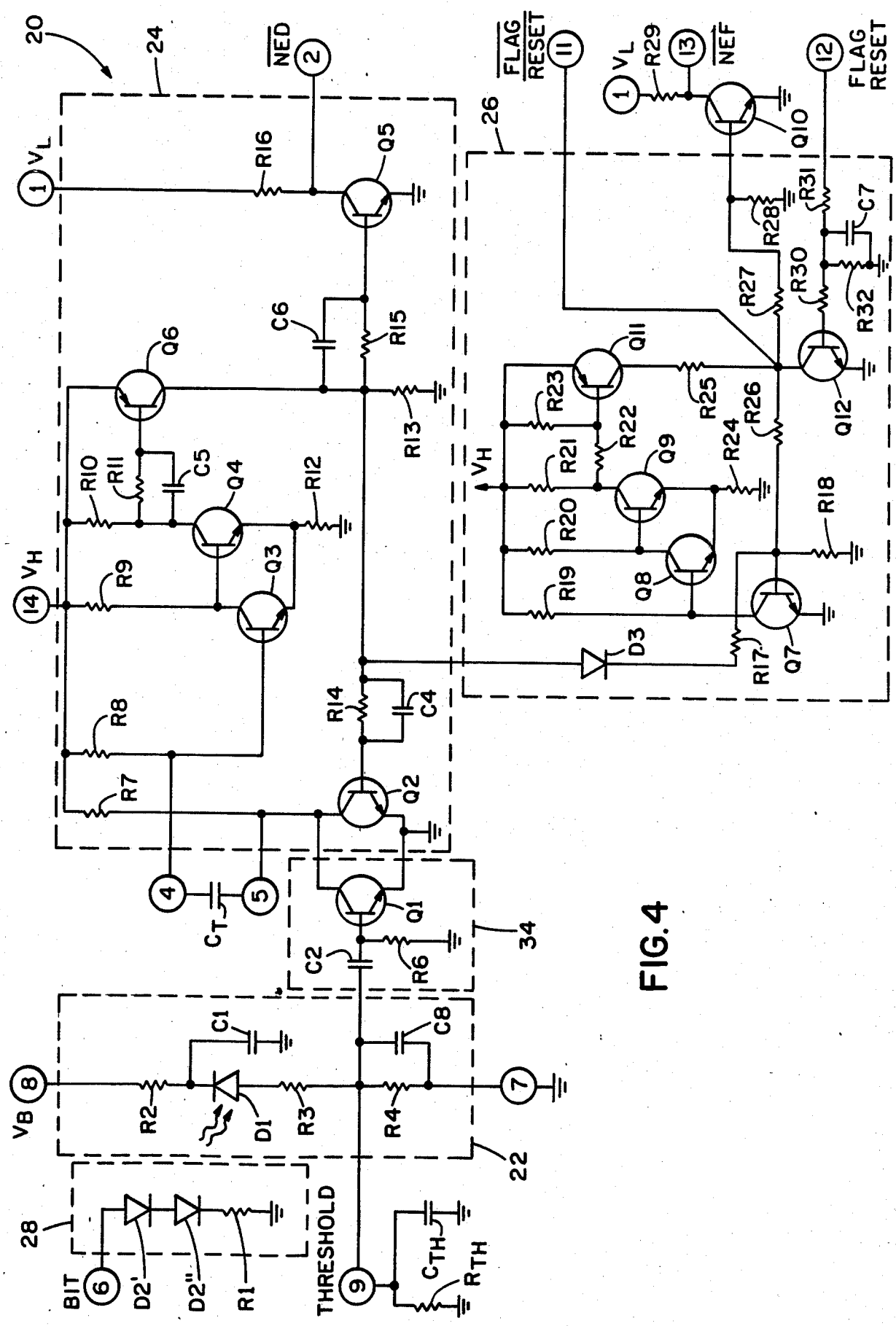
FIG. 4 is a schematic circuit diagram of the detector of FIG. 3.
Figure 5:
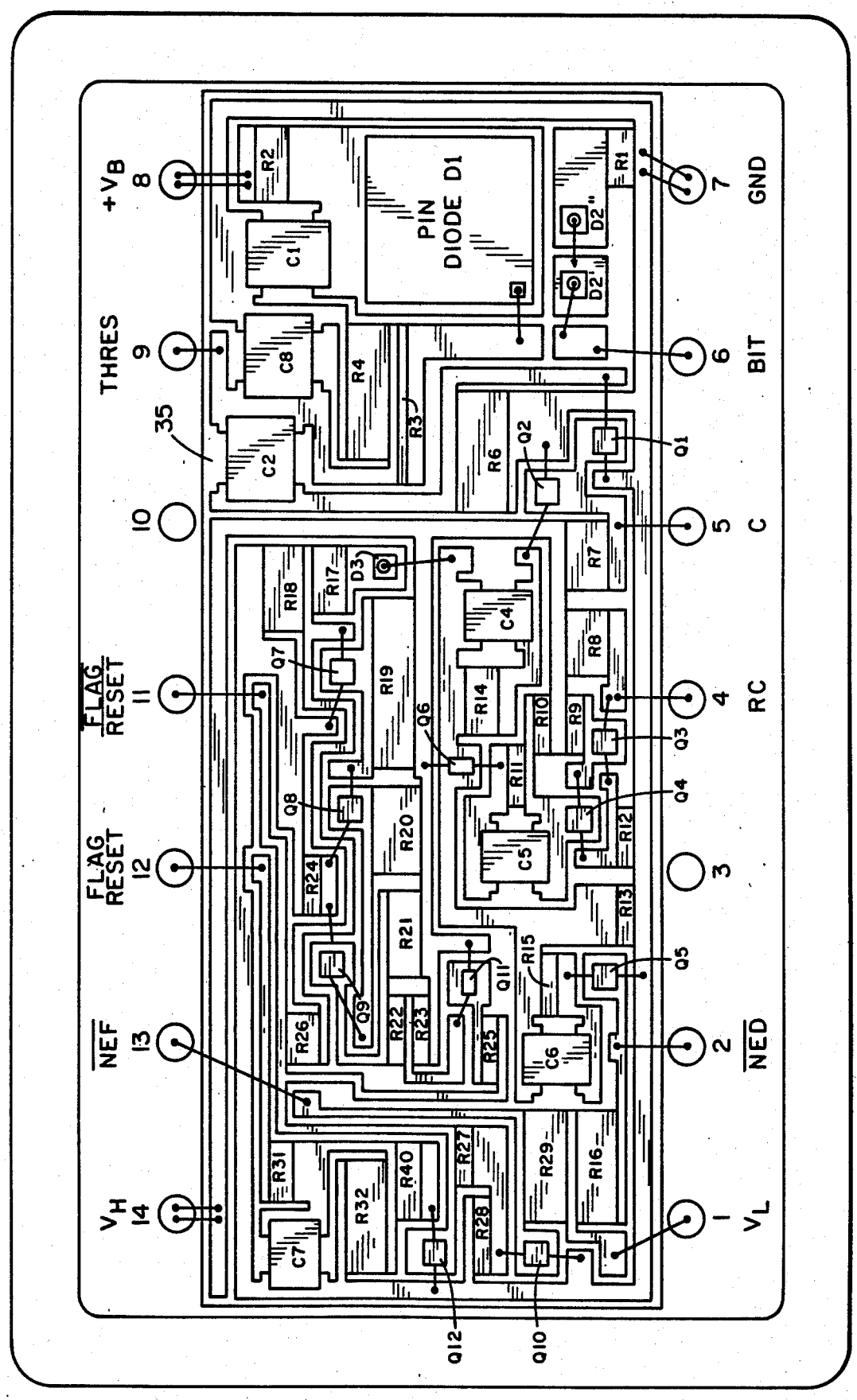
FIG. 5 is a plan view of hybrid microcircuitry included in the detector of FIG. 3, with certain components illustrated in simplified form.

A schematic circuit diagram of the nuclear event detector is shown in FIG. 4, while FIG. 5 is a plan view of the hybrid microcircuitry with certain components shown in simplified form. Referring to FIG. 4, the sensor circuit 22 includes a PIN diode D1 the cathode of which is connected to $+V_B$ through a resistor R2, and to ground through a filter capacitor C1. The anode of PIN diode D1 is connected to ground through a voltage divider made up of the series combination of a resistor R3 and a resistor R4. The common connection of the resistors R3 and R4 is the pin 9 connection for the threshold adjustment electrical component, which is shown as a capacitor $C_{TH}$ or a resistor $R_{TH}$. The resistor R4 is shunted by a capacitor C8 and pin 9, which is the output of the sensor circuit 22, is coupled to a fast switching transistor amplifier 34 through a coupling capacitor C2. The resistor R4 and the capacitor C8 determine the preset sensor threshold and the resistor R4 can be trimmed to a desired threshold. The amplifier 34 includes an NPN transistor Q1, the emitter of which is grounded and the collector of which is connected to $V_H$ through a load resistor R7. The base of the transistor Q1 is connected to ground through a biasing resistor R6 and to the coupling capacitor C2. It will be appreciated that the PIN diode D1 is operated reversed biased which provides a very fast photocurrent generator. The PIN diode is a type of solid state ionization chamber. The high speed of the PIN diode is obtained because the excess electron-hole pairs are collected by drift under the high field across the depletion region. In addition to its rapid response, the PIN diode has a high photocurrent generation rate, thereby providing the capability of detecting relatively low dose rate levels.

Figure 6:
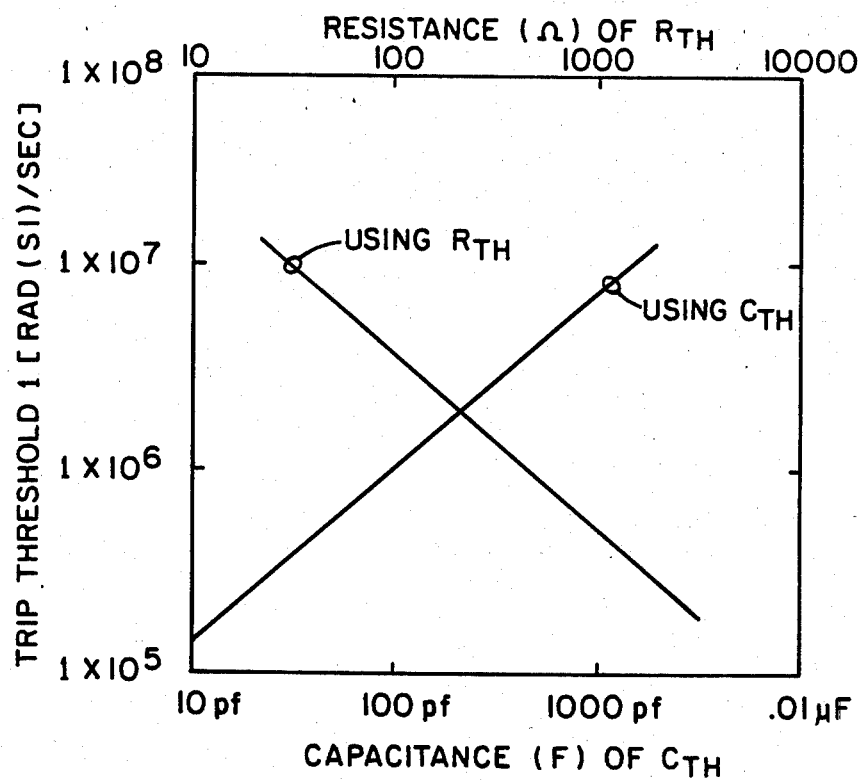
FIG. 6 is a graph illustrating the relationship between the sensor trip threshold and the capacitance of a capacitor $C_{TH}$ or the resistance of a resistor $R_{TH}$ external to the detector package.

The photocurrent is used to charge the base-emitter capacitance of the transistor Q1. The transistor Q1 isolates the sensor circuit 22 from the timing curcuit 24 and provides a predeterminable threshold. The dose-rate sensitivity or threshold is adjusted by varying the impedance connected between pin 9 and ground. Any impedance connected to this pin is in parallel with the trigger circuit (made up of the resistor R4 and the capacitor C8) for the transistor Q1, and shunts photocurrent from the PIN diode away from the trigger circuit. Consequently, the lower the impedance at pin 9, the higher the pulsed dose-rate threshold detection level. The threshold level is shown being adjusted by a capacitor $C_{TH}$ or a resistor $R_{TH}$, although either a resistor andor a capacitor could be connected between pin 9 and ground. FIG. 6 is a graph illustrating how the dose-rate threshold detection level for a 20 nanosecond pulse varies with the value of $C_{TH}$ or $R_{TH}$.

The test circuit 28 includes two light emitting diodes D2 series-connected with a load resistor R1 to ground. It will be appreciated that the application of a high active signal to pin 6 results in the passage of current through the light emitting diodes D2, which provides light impinging on the PIN diode D1, thereby rendering it more photoconducting. Thus, by providing a standard amount of radiation (light) and observing the outputs of the detector, its proper operation can be tested.

Figure 7:
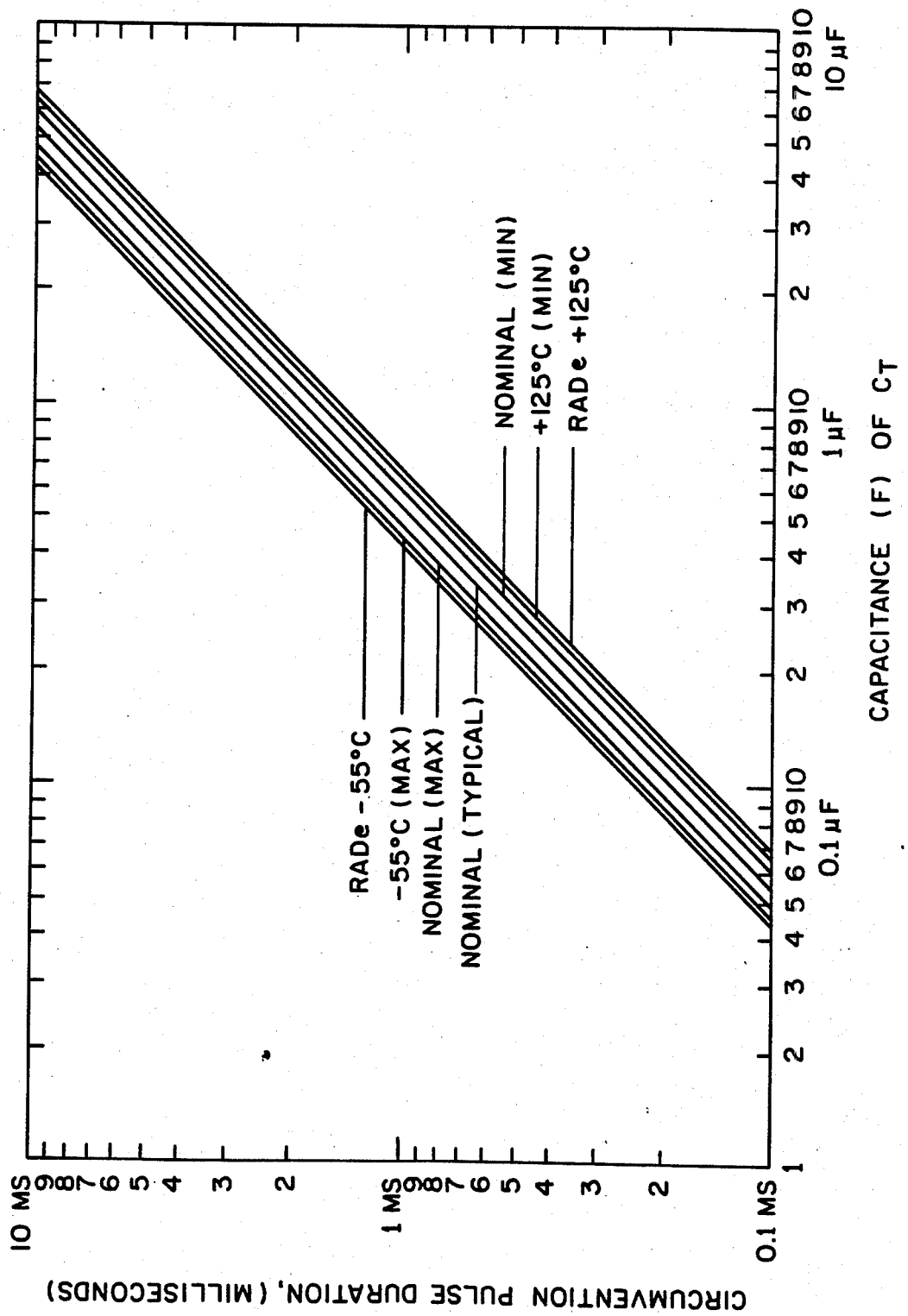
FIG. 7 is a graph showing the relationship between the timer pulsewidth and the capacitance of a timing capacitor $C_T$ external to the detector package.

The timer circuit 24 includes a Schmitt trigger circuit made up of NPN transistors Q3 and Q4. The base of the transistor Q3 is connected to the output of the amplifier 34 through the external timing capacitor $C_T$ (connected between pins 4 and 5), and is also connected to $V_H$ through a resistor R8. As shown by the curves of FIG. 7, the output pulsewidth of the timer circuit output varies with the capacitance of $C_T$. Included in FIG. 7 are curves showing the predicted minimum and maximum pulsewidths, variations due to temperature and finally, minimum and maximum values which include both temperature and total gamma and neutron dose radiation effects. The emitters of the transistors Q3 and Q4 are grounded through a resistor R12, and the collector of the transistor Q3 is connected to the base of the transistor Q4 and to $V_H$ through a resistor R9. The collector of the transistor Q4 is connected to $V_H$ through a resistor R10 and to the base of a PNP transistor Q6 through the parallel combination of a resistor R11 and a speed-up capacitor C5. The collector of the transistor Q6 is grounded through a current-limiting resistor R13 and connected to the base of a latching NPN transistor Q2 through a parallel combination of a resistor R14 and a speed-up capacitor C4. The collector of the transistor Q6 also is connected to the base of an output buffer NPN transistor Q5 through the parallel combination of a resistor R15 and a capacitor C6. The collector-emitter circuit of the transistor Q2 is interconnected between the timing capacitor $C_T$ and ground, while the emitter of the transistor Q5 is grounded and its collector connected to $V_L$ through a current-limiting resistor R16. The collector of the transistor Q5 provides the $\overline{NED}$ signal at pin 2.

The operation of the sensor circuit 22, the amplifier circuit 34 and the timer circuit 24 is as follows: Upon receiving the pulse of ionizing radiation (or upon operation of test circuit 28) the PIN diode D1 generates photocurrent and if and when and the threshold level is surpassed, causes a voltage drop across the resistor R6 resulting in a high voltage to the base of the transistor Q1, rendering its collector-emitter circuit conductive. With the transistor Q1 conducting, a low signal resulting at pin 5 is coupled through the capacitor $C_T$ to pin 4, thereby turning off the transistor Q3, which turns on the transistor Q4. Conduction of the collector-emitter circuit of the transistor Q4 results in a low signal at the base of the transistor Q6, causing it to conduct. With the transistor Q6 conducting, a high signal is applied to the bases of the transistor Q2 and the output buffer transistor Q5, the collector voltage of which goes low, providing the signal $\overline{NED}$ as the output at pin 2. Although the transistor Q1 turns off, the transistor Q2 meanwhile latches in, causing the transistor Q3 to remain non-conductive and the transistor Q4 to remain conductive until such time as the external capacitor $C_T$ charges to a high voltage level from $V_H$ through the resistor R8. When the capacitor $C_T$ charges sufficiently that the voltage at the base of the transistor Q3 reaches its threshold level, the transistor Q3 conducts, which turns off the transistors Q4, Q6, Q2 and Q5, resulting in the return of the output at pin 2 to the high logic state. The pulsewidth of the signal $\overline{NED}$ is thus a function of the capacitance of the capacitor $C_T$ and the adjustment of said capacitor adjusts such pulsewidth. With the transistors Q1 and Q2 in their off states, the external capacitor $C_T$ is free to discharge through the resistors R7 and R8.

The latch circuit 26 includes an NPN transistor Q7, the base of which is connected to the collector of the timer circuit transistor Q6 through the series combination of an isolation diode D3 and a resistor R17. The presence of the diode D3 prevents a failure in the latch circuit 26 from triggering the pulse timer circuit 24. The emitter-collector circuit of the transistor Q7 is connected between ground and $V_H$ through a current-limiting resistor R19, and is further connected to the base of an NPN transistor Q8 which is part of a Schmitt trigger including an NPN transistor Q9. The emitters of the transistors Q8 and Q9 are commonly referred to ground through a resistor R24. The collector of the transistor Q8 is commonly connected to the base of the transistor Q9 and to $V_H$ through a resistor R20. The collector of the transistor Q9 is commonly connected to $V_H$ through a resistor R21 and to the base of a PNP transistor Q11 through a resistor R22. The base of the transistor Q11 is also connected to $V_H$ through a bias resistor R23 which keeps the base and emitter of the transistor Q11 at the same voltage level until operation of the Schmitt trigger. The collector of the transistor Q11 is series-connected to the bases of transistors Q7 and Q10 through resistors R25 and R26, and resistors R25 and R27, respectively. The common junction of resistors R25, R26 and R27 is brought out to pin 11. The transistor Q7, which has its base connected to ground through a resistor R18, is latched on due to the conduction of the transistor Q11 after the output of the timer circuit 24 goes low. The transistor Q10, the base of which is grounded through a resistor R28, has its collector-emitter circuit connected to ground from $V_L$ through a load resistor R29. It is the collector of the transistor Q10 which provides the $\overline{NEF}$ output indicating that a nuclear event has taken place. The collector of the transistor Q11 is also connected to ground through the collector-emitter circuit of an NPN transistor Q12. The base of the transistor Q12 is series connected by a pair of resistors R30 and R31 to the FLAG RESET pin 12, with the junction of the resistors R30 and R31 grounded through the parallel combination of a biasing resistor R32 and a filter capacitor C7.

The operation of the latch circuit 26 is as follows: Upon transistor Q6 of the timer circuit 24 being rendered conductive, a high signal is applied to the base of the transistor Q7 through the isolation diode D3, causing the transistor Q7 to conduct. This causes a low signal to be applied to the base of the Schmitt trigger transistor Q8, turning it off, which results in conduction of the transistors Q9 and Q11. With the transistor Q11 conducting, a high signal is applied to the base of the transistor Q7. The transistor Q7 is latched in to keep that transistor conducting when the output of the timer circuit 24 goes low. The conduction of the transistor Q11 also results in the conduction of the output buffer transistor Q10, which provides the nuclear event flag signal $\overline{NEF}$ at pin 13. The nuclear event flag signal $\overline{NEF}$ remains at a low logic output until such time as the logic latch circuit 26 is deliberately reset. This can be achieved by applying a high signal at the flag reset pin 12, which results in the conduction of the transistor Q12. This causes the application of a low level signal at the base of the transistor Q7, which turns it off, allowing the transistor Q8 to conduct. With transistor Q8 conducting, transistors Q9, Q11 and Q10 all turn off. The same results can be achieved more directly by applying a low level signal at the $\overline{FLAG\ RESET}$ pin 11.

Referring to FIG. 5, the various components of the nuclear event detector 20 are part of a hybrid microcircuit. The resistors are the products of film patterns on an insulating substrate 35. This results in a very compact package 32 which can be tested by the manufacturer. One way of providing an ionizing radiation pulse for pretesting of the detector is through the use of a linear accelerator. The many advantages of testing at the manufacturing facility, where a large, expensive device such as a linear accelerator can be conveniently used, are readily apparent. The only components external to the sealed package 32 are the threshold capacitor $C_{TH}$ or resistor $R_{TH}$ connected between pin 9 and ground, and the timing capacitor $C_T$ connected between pins 4 and 5. Relatively unskilled personnel can choose the values for particular threshold levels and timing pulse durations simply by referring to calibration tables or the graphs of FIGS. 6 and 7, the former plotting the relationship between the threshold level and the capacitance of the capacitor $C_{TH}$ or the resistance of the resistor $R_{TH}$ and the latter showing the relationship between the pulsewidth of $\overline{NED}$ and the capacitance of the capacitor $C_T$.

Following is a resistor trim chart and a parts lists for the nuclear event detector 20:

RESISTOR TRIM CHART

| QTY | TOL | HI VAL | NOM VAL | LO VAL | RES REF |
|---|---|---|---|---|---|
| 1 | 2% | 20.4K | 20K | 19.6K | R4 |
| 3 | 2% | 10.2K | 10K | 9.8K | R6,R16,R29 |
| 1 | 2% | 8634 Ω | 8.2K | 8036 Ω | R32 |
| 1 | 2% | 3366 Ω | 3.3K | 3234 Ω | R7 |
| 1 | 2% | 2040 Ω | 2.0K | 1960 Ω | R21 |
| 1 | 2% | 1530 Ω | 1.5K | 1470 Ω | R19 |
| 1 | 2% | 1326 Ω | 1.3K | 1274 Ω | R8 |
| 1 | 2% | 1020 Ω | 1K | 980 Ω | R2 |
| 1 | 2% | 918 Ω | 900 Ω | 882 Ω | R14 |
| 1 | 2% | 867 Ω | 850 Ω | 833 Ω | R18 |
| 1 | 2% | 612 Ω | 600 Ω | 588 Ω | R28 |
| 2 | 2% | 510 Ω | 500 Ω | 490 Ω | R23,R17 |
| 2 | 2% | 479.4 Ω | 470 Ω | 4606 Ω | R30,R31 |
| 1 | 2% | 459 Ω | 450 Ω | 441 Ω | R20 |
| 1 | 2% | 408 Ω | 400 Ω | 392 Ω | R9 |
| 2 | 2% | 306 Ω | 300 Ω | 294 Ω | R10,R13 |
| 1 | 2% | 255 Ω | 250 Ω | 245 Ω | R25 |
| 1 | 2% | 244.8 Ω | 240 Ω | 235.2 Ω | R24 |
| 1 | 2% | 204 Ω | 200 Ω | 196 Ω | R26 |
| 2 | 2% | 153 Ω | 150 Ω | 147 Ω | R11,15 |
| 3 | 2% | 102 Ω | 100 Ω | 98 Ω | R12, R22,R27 |
| 1 | 2% | 27.54 Ω | 27 Ω | 26.46 Ω | R3 |
| 1 | 2% | 76.5 Ω | 75 Ω | 73.5 Ω | R1 |

PARTS LIST

| QTY | PART NO. | DESCRIPTION | CXT REF |
|---|---|---|---|
| 1 | 94001-S1 | CARRIER-MTS | S1 |
| 4 | 250R09N-820JP | 82 PF CAPACITOR - JOHANSON | C4–C7 |
| 3 | 250R118-013 MP | .01UF CAPACITOR- JOHANASON | C1,C2,C3 C3 |
| 2 | SSH-FV94 | L.E.D. - SIEMEN | D2 |
| 1 | SSH-975 | PIN DIODE - SIEMEN | D1 |
| 1 | 1N4150 | SWITCHING DIODE - SPRAGUE | D3 |
| 2 | 2N2894 | PNP TRANSISTOR - MOTOROLA | Q6,Q11 |
| 9 | 2N3511 | NPN TRANSISTOR - MOTOROLA | Q2–Q5 Q7–Q10, Q2 |
| 1 | 2N2857 | NPN TRANSISTOR - MOTOROLA | Q1 |
| 1 | 250R09N | SELECTED 100PF/ 1000PF CAP | C8 |

In addition to the high speed and flexible design characteristics of detector 20, nuclear hardness is a primary objective. To ensure reliable triggering, the circuitry has been designed to have an ionizing dose-rate upset threshold above the threshold detection level of the sensor circuit 22 with the PIN diode D1. In this case, upset is defined as triggering of the device by photocurrents generated within the circuitry without the PIN diode D1 installed. This guarantees that the nuclear event detection signal $\overline{NED}$ is triggered by the photocurrent generated by the PIN diode. Thus, the sensing threshold for ionizing radiation can be reliably adjusted by varying the impedance through which the PIN diode photocurrent must flow. This is accomplished by connecting the capacitor $C_{TH}$ or the resistor $R_{TH}$ between the threshold adjustment pin 9 and ground. Larger capacitance or smaller resistance requires a larger photocurrent from the PIN diode to trigger the device, thus raising threshold detection level for the pulsed ionizing radiation.

When using a resistor $R_{TH}$ to adjust the threshold level, the resistor should be DC isolated from pin 9 using a series coupling capacitor because the BIT circuit is sensitive to the DC impedance connected to pin 9. The time constant of the coupling capacitor and the adjustment resistor $R_{TH}$ should be long enough to prevent the coupling capacitor from charging significantly during the ionizing radiation pulse and the time constant should be short enough that the coupling capacitor will charge during BIT to ensure reliable built-in test operation. This is shown schematically in FIG. 8 where a capacitor $C_C$ is the coupling capacitor.

The term "hardness" relates to the ability of an electrical circuit to operate in spite of exposure to ionizing radiation resulting from detonation of a nuclear weapon. One aspect of hardness is the ability of the circuit to resist interference with normal circuit operations during the nuclear event (upset). A second aspect of hardness is the ability of the circuit to prevent permanent damage to itself occasioned by dissipation of energy caused by high, transient photocurrents over a period of time (burnout). When semiconductor materials experience ionizing radiation excess electron-hole pairs are generated, causing a reduction of resistance of the semiconductor material.

More specifically and with regard to transistors of the timer circuit 24 and the latch circuit 26, upset characteristics are improved by using resistors across the base-emitter circuit of transistors (for example, the resistors R10 and R11 and the transistor Q6, and the resistor R23 and the transistor Q11) to provide paths for photocurrents generated in the transistors. Burnout occurs because too much current from the power supply flows through the transistor occasioned by its lowered resistance due to generation of the photocurrents. With time, heat builds up which further degrades the device. The extreme cases of burnout are melting and carbonization of the semiconductor. The burnout characteristics of the circuits 24 and 26 are improved by placing current limiting resistors (for example, resistor R12) in series with the base-emitter and collector-emitter circuits of transistors.

The latch circuit 26 is designed to have lower power requirements than the timer circuit 24 because the latch circuit normally would operate for a longer period of time than the timer circuit. It will be appreciated that there are certain similarities between the latch circuit and the timer circuit. The latch circuit does not include a capacitor analogous to the timing capacitor $C_T$, and the collector of the transistor Q7 is directly connected to the base of the transistor Q8. To reduce power consumption in the latch circuit, the resistors in the latch circuit have higher resistances than the comparable resistors in the timer circuit. For example, the latch circuit resistor R21 is 2000 ohms while analogous timer circuit resistor R10 is 300 ohms. Unfortunately, this increase in resistance tends to degrade the upset level of the latch circuit because the flow of photocurrents is reduced. To improve the upset hardness of the latch circuit with its larger resistances, additional base-emitter shunt resistors, such as the resistors R23 and R28, have been added to provide current paths for the device photocurrents.

There are basically two types of resistors in the timer circuit 24 and the latch circuit 26: (1) those which are in series with base-emitter circuits of the transistors, and (2) those which are in parallel with the base-emitter circuit of the transistors. As mentioned above, the shunt resistors improve the upset characteristics of the circuit. These resistors are made as small as practical so that the circuit will have the highest threshold. Thus, the upset threshold of the latch circuit and timer circuit are above the selected threshold of the PIN diode sensing circuit. These shunt resistors take base current away from the transistor-base circuits. The series resistors, such as resistors R24 and R25, provide the base current of each transistor and additionally provide the current limitation for the collector circuits. These resistors should be as small as practical to provide the most base current consistent with maintenance of safe operating levels and reduced power consumption of the latch circuit.

One use of the nuclear event detector is to drive circuitry which will prevent burnout of semiconductors due to the generation of large photocurrents. To ensure that the detector itself is not damaged by the generation of large photocurrents at very high ionizing dose rates, all semiconductor junctions in the hybrid microcircuitry are current limited to a safe operating level. This is achieved by operating all semiconductors in the saturated mode when turned on, with current limiting resistors.

In addition, the hybrid microcircuit will operate with the severe parameter degradation that the internal semiconductors will experience from the other radiation exposure. The two exposures of concern are neutrons and total ionizing dose. The total ionizing dose is usually accumulated over a relatively long period of time (seconds to minutes), and therefore may not be of much concern to the operation of the hybrid. In systems that must withstand multiple ionizing events, this environment is important, and as such has been accounted for in the design of the detector. The neutron fluence is received in a relatively short pulse of a few milliseconds in duration. Because neutrons are particles, they travel slower than the x-rays or gamma rays, and consequently arrive tens of microseconds to tens of milliseconds later. Both of these exposures produce permanent parameter degradation in semiconductors. The primary effects are reduced current gain, increased leakage currents and increased voltage drops. In addition to these permanent changes, the neutron pulse produces a further transient decrease in transistor current gain, which anneals out shortly after the neutron pulse decays. The hybrid microcircuit described herein operates even with both the transient and permanent degradation produced by these two environments due to the use of the resistors discussed above placed in series and in parallel with the collector-emitter circuits and base-emitter circuits of the transistors.

The operating range of the nuclear event detector is as follows:

| Temperature Range: | −55° C. to +125° C. |
|---|---|
| Radiation levels: | |
| Prompt gamma detection range ($\gamma$) | $5 \times 10^5$ to $1 \times 10^7$ rad(Si)/s |
| Prompt gamma survival level ($\gamma$) | $\geq 10^{12}$ rad(Si)/s |
| Gamma total dose ($\gamma$) | $\geq 10^6$ rad(Si) |
| Neutron fluence ($\Phi$) | $\geq 10^{13}$ n/cm$^2$ (1 MeV equivalent) |

The BIT circuit 28 remains functional at these levels of neutron fluence and gamma total dose, however, it does not meet its operating specifications.

Figure 8:
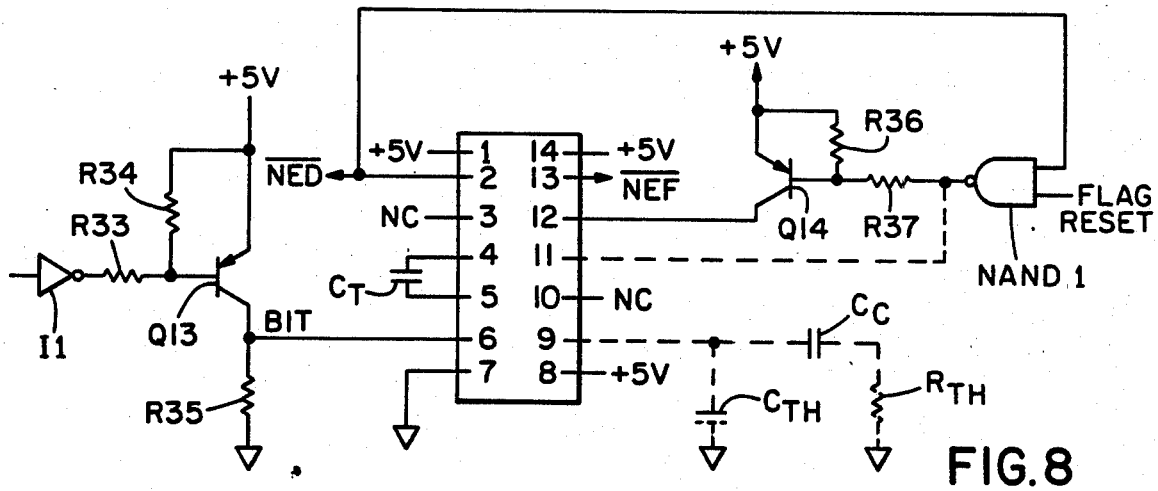
FIG. 8 is a circuit diagram, partially schematic in nature, illustrating the nuclear event detector as operated from a single +5 V power supply.

The simplest way to operate the detector 20 is from a single +5 v supply, using the nuclear event detection signal $\overline{\text{NED}}$ to drive circumvention hardware, using the nuclear event flag signal $\overline{\text{NEF}}$ to indicate that an event has occurred, and using a built in test signal BIT to test the hybrid microcircuitry, the circumvention hardware and software recovery system. Connections to the device and the interface circuitry for this application are shown in FIG. 8. All of the power connections ($V_B$, $V_H$ and $V_L$) are connected to a common +5 V power supply. This +5 V power supply must be hardened so that a voltage level of at least +4.5 V is maintained on the hybrid microcircuit during the entire circumvention period.

The interfaces for FLAG RESET and BIT signals are shown. The interface for the BIT signal includes a PNP transistor Q13 the collector of which is commonly connected to pin 6 and to ground through a current-limiting resistor R35. A resistor R34 supplies leakage current when the transistor Q13 is off. An inverter I1 has its output coupled to the base of the transistor Q13 through an isolation resistor R33. A high signal applied at the input of the inverter turns on the transistor Q13 to apply the BIT signal. As shown in the FIG. 8, the signal $\overline{\text{NED}}$ is NAND'ed with the FLAG RESET signal by a NAND gate NAND 1. This inhibits the flag reset input during the timeout period to ensure that the flag is set correctly. The gate NAND 1 is an open collector driver and its output is connected to the base of a PNP transistor Q14 through an isolation resistor R37. The collector of the transistor Q14 is connected to pin 12 while its emitter is connected to +5 V. A resistor R36 connected between +5 V and the base of transistor Q14 supplies leakage current when the transistor Q14 is off. A simpler reset interface is to use the output of the open collector gate NAND 1 to drive $\overline{\text{FLAG0}}$ $\overline{\text{RESET}}$ (at pin 11) directly. The $\overline{\text{FLAG}}$ $\overline{\text{RESET}}$ input (pin 11) must be driven by an open collector driver to prevent the flag, $\overline{\text{NEF}}$, from being set by the external reset circuitry. Open collector drivers employ transistors having their emitters grounded so that their collector outputs can only sink current, not source current.

Figure 9:
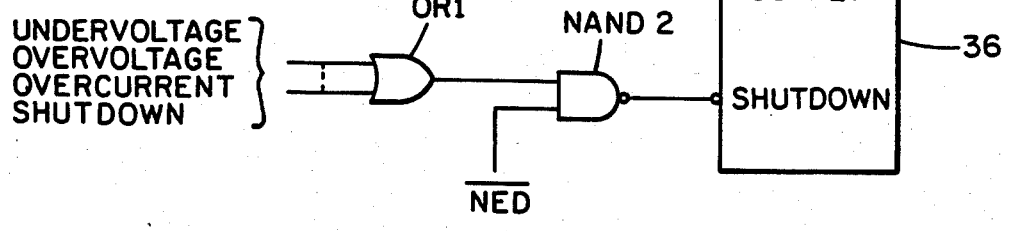
FIG. 9 illustrates a circuit to inhibit shutdown of the power supply.

A hardened power supply 36 (FIG. 9) must continue to operate following the pulse of ionizing radiation. Upon upset, normal shutdown circuitry can produce a shutdown signal and turn the power supply off. To prevent this from happening, the $\overline{\text{NED}}$ signal can be NAND'ed in a NAND gate NAND 2 with the final shutdown signal at the output of an OR gate OR1 to inhibit shutdown during the timeout period. This circuit gives the shutdown circuitry ample time to recover.

Figure 10:
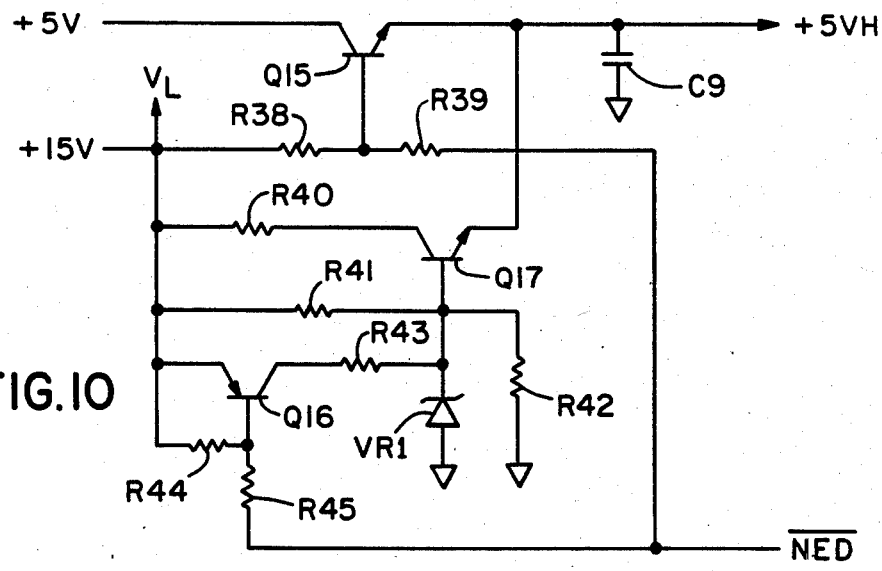
FIG. 10 is a schematic circuit diagram of an alternative embodiment of a power supply where multiple output voltages are available.

The power switching design shown in FIG. 10 shows how the detector 20 can be operated from a +5 V supply during normal operation, and from a simple series pass regulator off a +15 V supply during the timeout period. The advantages of this scheme are: (1) the design requirements for the power supply can be relaxed; (2) during normal operation the nuclear event detector is operated from the +5 V supply—minimizing power consumption; and (3) during the timeout period the hybrid microcircuit receives its power from a higher voltage supply to minimize the size of power supply filter capacitors required.

A transistor Q15 is operated in saturation during normal operation. Base drive is provided by a resistor R38 from the +15 V supply. Transistors Q16 and Q17 are biased off during normal operation. A resistor R43 provides bias to a zener diode VR1. This provides a leakage current path for the diode and both transistors. A resistor R41 is used in conjunction with a resistor R42 to establish a voltage at the base of the transistor Q17. The voltage should be kept below the normal zener voltage, and is used to perform two functions. First, it keeps the base voltage of the transistor Q17 below the emitter voltage to ensure that the transistor is held off. Secondly, it keeps the reverse voltage across the base-emitter of the transistor Q17 below the breakdown voltage of the base-emitter junction. A resistor R44 keeps the base and the emitter voltages of the transistor Q16 equal to hold the transistor off, and provides a leakage current path for the collector-base junction of the transistor Q16.

When the detector 20 senses the ionizing radiation, the signal $\overline{\text{NED}}$ will go low, turning the transistor Q15 off and transistors Q16 and Q17 on. The transistor Q16 will provide normal zener bias current to the diode VR1 and base current to the transistor Q17. The total current will be limited by the resistor R43. A resistor R45 will provide the base current for the transistor Q16. A resistor R39 works in conjunction with the resistor R38 to form a voltage divider which reduces the voltage at the base of the transistor Q15 below its emitter voltage, thus turning it off. Again, the voltage at the base of the transistor Q15 is kept above ground to reduce the voltage across the reverse-biased base-emitter junction. To ensure proper operation, the load supply for the detector ($V_L$) should be connected to the +15 V supply.

Using this design, the value of the storage capacitor C9 used for the +15 V supply can be kept relatively small because the detector requires only a fixed amount of energy during the timeout period, and the voltage can drop below its normal operating limits as long as there is enough voltage to operate the series pass regulator and provide at least +4.5 V to the device. The amount of drop is dependent upon the resistance of a resistor R40. The function of this resistor is to provide current limiting for the transistor Q17 during the ionizing radiation pulse to prevent burnout. For reliable operation, the value of this resistor should be chosen to keep the collector current of the transistor Q17 within its safe operating region.

Figure 11:
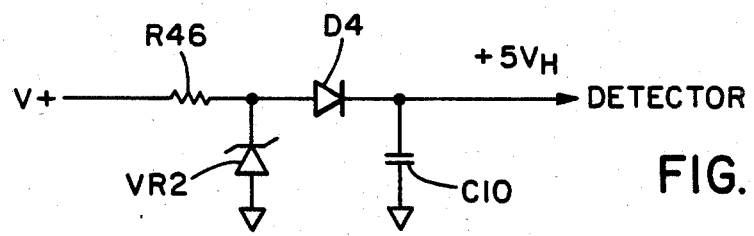
FIG. 11 is a schematic circuit diagram of another alternative embodiment of a power supply.

A simple way to supply power to the detector during the timeout period provided by the timer circuit 24 is shown in FIG. 11. The energy is provided by a local storage capacitor C10 which is isolated by a diode D4 from the power supply output V+. Because of the diode drop, this circuit must be operated from a supply voltage approximately one diode drop higher than the normal +5 V required. The main disadvantage of this circuit is that the storage capacitance required is normally quite large. The capacitance required can be estimated, assuming that the detector 20 requires a constant current of 150 mA while it is operational. Assuming that the timeout period is 1 ms, the capacitance required is $C=It/V$, where I=150 mA; t=1 ms; and V=5.0−4.5=0.5 V. The calculation of the allowable change in capacitor voltage during the operational period assumes that the minimum voltage supplied by the power supply through the diode is 5.0 V. Substituting these values into the above equation gives a minimum capacitance of 300 μf.

The resistor R46 and the zener diode VR2 shown in FIG. 11 need not be used if the appropriate voltage of approximately +6 V is available. If not, the resistor R46 and the zener diode VR2 can be used to provide the proper voltage from a normally higher supply voltage. The added components also reduce the regulation requirements of the power supply output. Further temperature compensation can be achieved by placing another diode identical to the diode D4 in series with the zener diode VR2.

Figure 12:
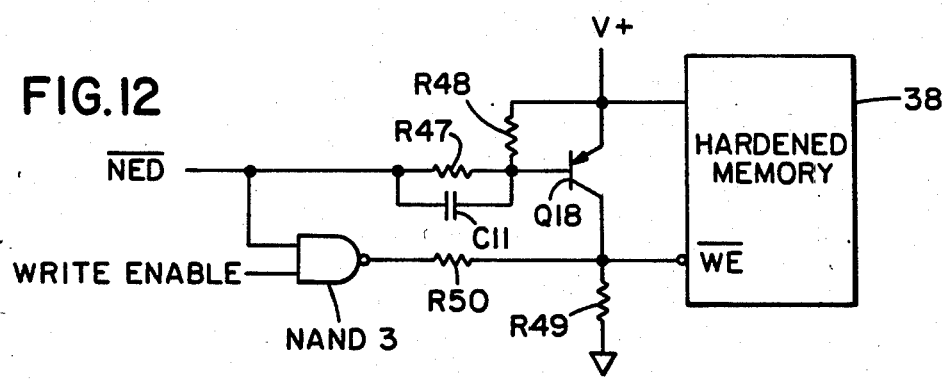
FIG. 12 is a schematic diagram illustrating a circuit to inhibit writing into a hardened memory.

The function of hardened memory is to maintain data through an ionizing radiation event. A hardened memory, such as memory 38 shown in FIG. 12, is usually magnetic using plated wire or core memory technology; however, it can be semiconductor memory. In all cases, one function that must be performed as part of circumvention is to inhibit writing into the memory during a nuclear event. This is normally accomplished by disabling the write enable input. Writing into memory is normally enabled when the write enable signal goes low; thus the signal must be kept high during the timeout period. A circuit to perform this function is shown in FIG. 12. The signal $\overline{\text{NED}}$ is used to turn a transistor Q18 on, producing a logic high signal at the write enable input. A resistor R47 limits the base current to the transistor Q18. A capacitor C11 is a speed-up capacitor. It effectively bypasses the resistor R47 for a few nanoseconds to increase the current available to charge the base-emitter capacitance of the transistor Q18 and reduce the turn-on time of the transistor. A resistor R48 supplies leakage current when the transistor Q18 is off, and keeps the base and emitter voltages equal to hold the transistor off. For proper operation, the load supply ($V_L$) for the detector should be connected to V+. A resistor R49 provides a minimum load for the transistor Q18 when it turns on. A resistor R50 isolates the collector of the transistor Q18, the write enable input and the output of the write enable driver. This resistor R50 allows the output of a NAND gate NAND 3 to upset and generate a logic low signal while the write enable input sees the logic high generated by the transistor Q18.

The signal $\overline{\text{NED}}$ is NAND'ed in the NAND gate NAND 3 with the normal write enable signal to generate the correct output state of the driver gate. This reduces the power consumption of the circumvention circuitry once the driver gate has recovered from the radiation-induced upset. This can be significant because the resistance of the resistor R50 may be much smaller than the resistance of the resistor R49. The resistor R50 must be chosen such that a logic low can be generated at the write enable input with the driver gate output at its maximum value and the maximum low level input leakage current flowing through the resistor.

If the write enable input requires a logic high to be enabled, the transistor Q18 can be eliminated and the $\overline{\text{NED}}$ signal can be connected directly to the write enable input. The resistance of the resistor R50 is selected so that the voltage divider produced by the resistor R16 in the detector and the resistor R50 is small enough to generate a logic low at the write enable input reliably.

Burnout in electronic systems from ionizing radiation occurs through two mechanisms. First, at high ionizing dose rates the resultant photocurrents can be large enough to produce burnout. Protection against this type of burnout is normally provided by adding series-limiting impedance to limit the current and the total device power dissipation. Secondly, the photocurrents generated within integrated circuits can produce a condition called latchup, which results in burnout. Latchup is a parasitic SCR action within the integrated circuit through PNPN paths formed with substrate and other diffusion regions. Once this SCR action is initiated, the device will stay latched up until either it burns out or the supply voltage is removed. If the supply voltage is removed within several microseconds, the device will not be damaged. One method of protecting against latchup-induced burnout is to crowbar the power supplies much in the way they are crowbarred for an overvoltage condition.

Figure 13:
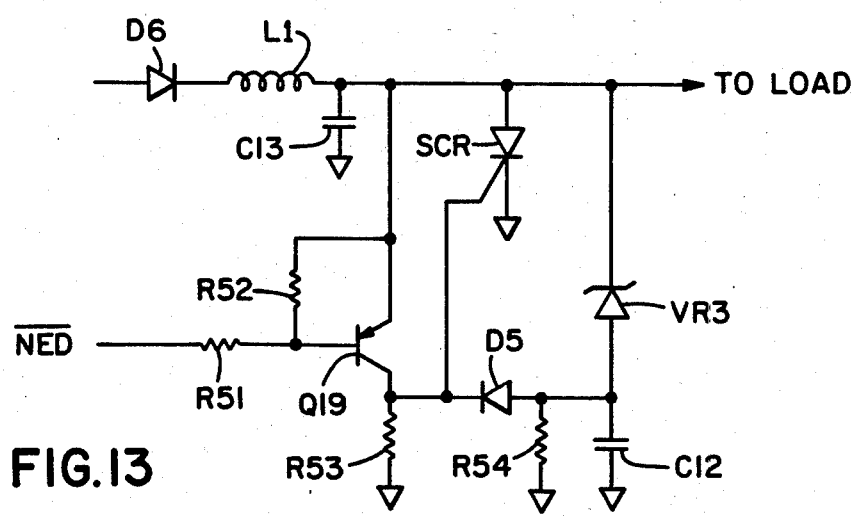
FIG. 13 is a schematic diagram of a power supply crowbar circuit.

The circuit shown in FIG. 13 shows how a normal overvoltage crowbar circuit can be modified to be driven by the detector 20 to drop the voltage to the load, and thus prevent burnout. A silicon controlled rectifier SCR, a zener diode VR3, a resistor R54 and a capacitor C12 comprise a normal overvoltage protection circuit. A transistor Q19, along with resistors R51 through R53, provide an interface between the $\overline{\text{NED}}$ signal and the SCR gate circuit. A diode D5 isolates the capacitor C12 from the hybrid trigger circuit to prevent the capacitor from delaying the triggering of the SCR. The resistor R51 limits the current to the base of the transistor Q19, while the resistor R52 provides a leakage current path for the transistor. The resistor R52 also keeps the base and emitter voltages of the transistor Q19 equal to hold the transistor off during normal operation. The resistor R53 provides a minimum load for the transistor Q19 and a leakage current path for both the SCR and the transistor. Upon sensing a nuclear event, the detector provides the $\overline{\text{NED}}$ signal which turns on the transistor Q19, causing a gate signal to be applied to the SCR. With the SCR conductive, both the inductor L1 and the capacitor C13 are free to discharge through the SCR. This causes the voltage across the anode and cathode of the SCR to drop below its holding value of about 1 V, resulting in turn off of the SCR.

Figure 14:
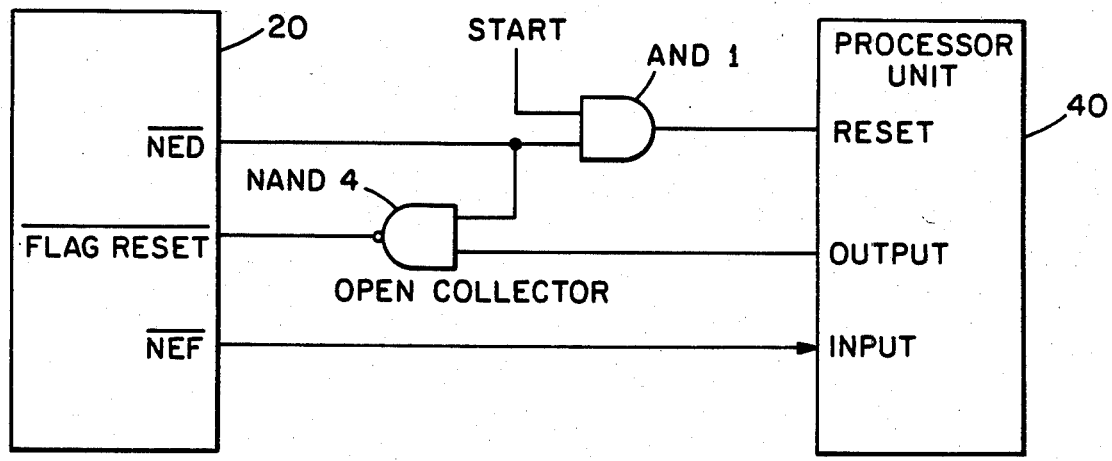
FIG. 14 is a schematic diagram illustrating a circuit to control a computer processor.

Ionizing radiation can upset the logic of a processor unit 40 (see FIG. 14), and can scramble the contents of the temporary storage registers of the processor. Without circumvention, the processor 40 could receive a bad instruction address which could either cause the processor to generate meaningless information, or if the address happened to be outside of the actual memory, the processor might hang up and stop processing completely. The detector 20 may be connected as shown in FIG. 14 to control the processor operations.

The $\overline{\text{NED}}$ signal and the normal start signal are connected as inputs to an AND gate AND 1 the output of which is connected to the reset input of the processor 40. This will stop data processing once an event has been detected, and initiate a restart at the end of the timeout period when $\overline{\text{NED}}$ goes to the high state. The $\overline{\text{NEF}}$ signal is connected to an interrupt input on the processor. During startup, the processor software must look at this interrupt to determine whether or not this is a normal power-up start or a restart following an ionizing event. Using this flag to determine that an event has occurred allows the software to skip most or all of the power-up BIT software, and, consequently, greatly reduces restart time.

If $\overline{\text{NEF}}$ is set to a low state when it is interrogated, the processor must perform a flag reset operation. Typically, one of the discrete outputs of the processor will be used to generate the flag reset signal. To prevent logic upsets in the processor from resetting the flag prematurely, the $\overline{\text{NED}}$ signal and the processor-generated flag reset signal are used as inputs to a NAND gate NAND4, the output of which is connected to the $\overline{\text{FLAG}}$ $\overline{\text{RESET}}$ pin 11 of the detector 20. This inhibits the processor flag reset signal during the NED timeout period.

An alternative to using an interrupt input and a discrete output of the processor to read and control the nuclear event flag, is to use two memory mapped locations for these functions. In a complex system this is probably preferable, because it leaves the limited number of actual processor interfaces available for normal system functions that occur regularly.

As a method of manufacturing a nuclear event detector 20 in a single manufacturing facility, the present invention includes the following steps:

A. A hybrid microcircuit is provided which includes an ionizing radiation sensor 22 designed to provide a sensor output when an ionizing radiation pulse exceeds a predetermined threshold level determined by the value of a first electrical component $C_{TH}$ or $R_{TH}$, and further includes a pulse timer circuit 24 which is designed to respond to the sensor output to provide a timing pulse of a duration determined by the value of a second electrical component $C_T$ and still further includes a latch circuit 26 which is designed to indicate that a nuclear event occurred.

B. The hybrid microcircuit is sealed in an enclosure, the detector 20 including connection means extending from inside the enclosure to outside the enclosure for connecting the electrical components.

C. The first electrical component is connected to the sensor and the second electrical component is connected to the timer circuit.

D. The proper operation of the detector is determined by exposing the sensor to ionizing radiation and the detector is pretested and certified at the manufacturing facility.

While in most applications it is desirable to set the threshold level by means of the resistor $R_{TH}$ or the capacitor $C_{TH}$ connected between pin 9 and ground, it is not always necessary to provide an external connection at the pin 9 because hybrid microcircuit components resistor R4 and capacitor C8 can be preset by the manufacturer to determine the threshold level of the sensor circuit 22 at the level needed in a particular application. More specifically and referring to FIG. 4, in the absence of external impedance connected at pin 9 the impedance of the parallel combination of the resistor R4 and the capacitor C8 determines the threshold level because the resistor R4 and the capacitor C8 function to drain base current from the transistor Q1. Even when the internal components provide the desired threshold level, it is desirable to provide the pin 9 for testing purposes, although not necessary where a user is able to specify the precise threshold level required.

In such an instance, the initial values of the resistor R4 and the capacitor C8 are selected so that the resulting threshold level of the sensor circuit is somewhat greater than the desired threshold level. Referring to FIG. 5 showing the hybrid microcircuit, the resistor R4 (as are all the resistors in the hybrid microcircuit) is the product of a film pattern extending between a pair of conductive strips deposited on the insulating substrate 35. The detector 20 is exposed to ionizing radiation (using a linear accelerator) so that the initial threshold level can be determined. The resistance of the resistor R4 is then increased sufficiently to cause the threshold level to decrease to the predetermined threshold level. A preferred method of increasing the resistance of the resistor R4 is by laser trimming. This is accomplished by burning away a portion of the film forming the resistor extending between the conductive strips. The cover 33 can then be sealed to the base, and the completed detector 20 can be pretested and certified.

It will also be appreciated that the timing capacitor $C_T$ could also be made part of the hybrid microcircuit so that pins 4 and 5 would not be required to be brought out. However, a capacitor of a construction which offers desirable capacitive thermal stability is too large to be placed conveniently in the small package 31, at least using present technology.

In view of the above, it will be seen that the several objectives of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A nuclear event detector for sensing the occurrence of a pulse of ionizing radiation occasioned by a nuclear explosion and having a pulse amplitude of at least about $5 \times 10^5$ rad(Si)/s and providing a switchable output in response to said sensing, said detector comprising:

a hybrid microcircuit including an ionizing radiation sensor for providing a sensor output signal when an ionizing radiation pulse incident thereon exceeds a predetermined threshold level determined by the value of a first discrete electrical component, and further includes a pulse timer circuit responsive to said sensor output signal for providing a timing pulse signal of a duration determined by the value of a second discrete electrical component;

a sealed enclosure enclosing said hybrid microcircuit; and connection means extending from inside said enclosure to outside said enclosure and including first connector means adapted for connection to said first electrical component for setting said threshold level, said connection means also including second connector means adapted for connection to said second electrical component for determining the duration of said pulse timing signal, whereby the threshold level and pulse duration are set by selection of value of two components which are disposed outside said enclosure.

2. A detector as set forth in claim 1 in the form of a plug-in package wherein said connection means comprises regularly spaced pins.

3. A detector as set forth in claim 1 wherein said hybrid microcircuit further includes a test circuit including a radiation source positioned to irradiate said sensor for testing operation of said sensor and said timer circuit.

4. A detector as set forth in claim 3 wherein said radiation source comprises a light emitting diode.

5. A detector as set forth in claim 4 wherein said sensor comprises a PIN diode.

6. A detector as set forth in claim 4 wherein said connection means comprises means for connection to a voltage source to operate said light emitting diode.

7. A detector as set forth in claim 1 wherein said hybrid circuit further comprises a latch circuit connected to said timer circuit for providing a latch output signal when said timer circuit provides said timing signal pulse and continuing to provide said latch output after the end of said timing signal pulse.

8. A detector as set forth in claim 7 wherein said latch circuit is a bistable logic latch, said connection means comprising means for receiving a reset signal for resetting said latch.

9. A detector as set forth in claim 7 wherein said hybrid circuit further comprises an output transistor buffer which is controlled by said output latch signal and said connection means comprises means for providing the output of said buffer outside said sealed enclosure.

10. A detector as set forth in claim 1 wherein said hybrid microcircuit further includes an output transistor buffer which is controlled by said timing pulse and said connection means comprises means for providing the output of said buffer outside said sealed enclosure.

11. A detector as set forth in any one of claims 7-9 wherein said hybrid microcircuit comprises resistance means for increasing the nuclear hardness of said timer circuit and said latch circuit above the nuclear hardness of said sensor so that said timer circuit and said latch circuit have upset levels above that of said sensor.

12. A nuclear event detector for sensing the occurrence of a nuclear explosion causing the occurrence of a pulse of ionizing radiation having a pulse amplitude of at least about $5 \times 10^5$ rad(Si)/s and providing a first output signal which is a pulse of a duration predetermined prior to said event and further comprising a second output signal indicating an event has occurred, said detector comprising:

an ionizing radiation sensor for providing a sensor output signal upon an ionizing radiation pulse incident thereon exceeding a threshold level determined by the value of a first discrete eletrical component, a pulse timer circuit responsive to said sensor output signal for providing said first output signal;

a latch circuit which is connected to said timer circuit and provides said second output signal when said timer circuit provides said first output signal and continues to provide said second output signal after the end of said first output signal;

a sealed enclosure in which said sensor, said pulse timer circuit and said latch circuit are enclosed; and connection means extending from inside said enclosure to outside said enclosure and including first connector means adapted for connection to said first electrical component for setting said threshold level, said connection means further including second connector means adapted for connection to a second discrete electrical component for determining the duration of said first output signal.

13. A detector as set forth in claim 12 wherein said timer circuit, said latch circuit and said sensor circuit constitute, at least in part, a hybrid microcircuit.

14. A detector as set forth in claim 13 further including a test circuit for testing the operation of said sensor circuit, said timer circuit, and said latch circuit, said hybrid microcircuit including said test circuit.

15. A detector as set forth in claim 14 wherein said sensor circuit includes a PIN diode.

16. A detector as set forth in claim 15 wherein said test circuit includes a light emitting diode positioned to irradiate said PIN diode.

17. A detector as set forth in claim 13 further including a transistor amplifier circuit interconnecting said sensor circuit and said pulse timer circuit.

18. A detector as set forth in claim 17 wherein said pulse timer circuit is a triggerable monostable pulse generator, said amplifer circuit functioning to amplify said sensor output to trigger said pulse generator.

19. A detector as set forth in claim 17 wherein said hybrid microcircuit includes said amplifer circuit.

20. A nuclear event detector system for providing a signal indicative of the occurrence of an ionizing radiation pulse occasioned by a nuclear explosion and having a Pulse amplitude of at least about $5 \times 10^5$ rad(Si)/s, said system comprising:

an ionizing radiation sensor sensor for providing a sensor output signal upon exposure to an ionizing radiation pulse incident thereon exceeding a predetermined threshold level;

a pulse timer circuit responsive to said sensor output signal for providing a timing signal pulse of a predetermined duration;

a sealed enclosure in which said sensor and said timing circuit are disposed;

a first discrete electrical component which is external to said enclosure and which is interconnected with said sensor and has a preselected value for setting said threshold level; and a second discrete electrical component which is external to said enclosure and which is interconnected with said timer circuit and has a preselected value for setting the duration of said pulse.

21. A system as set forth in claim 20 wherein said first electrical component is a capacitor and said second electrical component is a capacitor.

22. A system as set forth in claim 20 wherein said first electrical component is a resistor.

23. A system as set forth in claim 20 wherein said pulse timer circuit and said sensor are included in a hybrid microcircuit.

24. A method of manufacturing a nuclear event detector for sensing the occurence of a pulse of ionizing radiation occasioned by a nuclear explosion and having a pulse amplitude of at least about $5 \times 10^5$ rad(Si)/s, at a single manufacturing facility comprising:

providing a hybrid microcircuit including an ionizing radiation sensor for providing a sensor output signal when an ionizing radiation pulse incident thereon exceeds a predetermined threshold level determined by the value of a first discrete electrical component, and further including a pulse timer circuit responsive to said sensor output for providing a timing signal pulse of a duration determined by the value of a second discrete electrical component;

sealing said hybrid microcircuit in an enclosure with connector means extending from inside said enclosure to outside said enclosure for connecting said electrical components;

connecting said first electrical component to said sensor and connecting said second electrical component to said timer circuit; and exposing said detector to ionizing radiation for pretesting and certifying said detector at the manufacturing facility.

25. A nuclear event detector for sensing the occurrence of a pulse of ionizing radiation occasioned by a nuclear explosion and having a pulse amplitude of at least about $5 \times 10^5$ rad(Si)/s, and providing a switchable output in response to said sensing, said detector comprising:

a hybrid microcircuit including (1) an ionizing radiation sensor for providing a sensor output signal when an ionizing radiation pulse incident thereon exceeds a predetermined threshold level determined by the value of a first discrete electrical component, (2) a pulse timer circuit responsive to said sensor output signal for providing a timing pulse signal of a duration determined by the value of a second discrete electrical component and (3) a test circuit including a radiation source positioned to irradiate said sensor for testing operation of said sensor and said timer circuit; and a sealed enclosure enclosing said hybrid microcircuit.

26. A detector as set forth in claim 25 wherein said first electrical component is part of said hybrid microcircuit.

27. A detector as set forth in claim 25 wherein said radiation source comprises a light emitting diode.

28. A nuclear event detector for sensing the occurrence of a pulse of ionizing radiation occasioned by a nuclear explosion and having a pulse amplitude of at least about $5 \times 10^5$ rad(Si)/s, and providing a switchable output in response to said sensing, said detector comprising:

a hybrid microcircuit including (1) an ionizing radiation sensor for providing a sensor output signal when an ionizing radiation pulse incident thereon exceeds a predetermined threshold level determined by the value of a first discrete electrical component, (2) a pulse timer circuit responsive to said sensor output signal for providing a timing pulse signal of a duration determined by the value of a second discrete electrical component and (3) a latch circuit connected to said timer circuit for providing a latch output signal when said timer circuit provides said timing signal pulse and continuing to provide said latch output after the end of said timing signal pulse; and a sealed enclosure enclosing said hybrid microcircuit.

29. A detector as set forth in claim 28 wherein said first electrical component is part of said hybrid microcircuit.

30. A detector as set forth in claim 28 wherein said hybrid microcircuit further includes a test circuit including a radiation source positioned to irradiate said sensor for testing operation of said sensor, said timer circuit and said latch circuit.

* * * * *

UNITED STATES PATENT AND TRADEMARK OFFICE
CERTIFICATE OF CORRECTION

PATENT NO. : 4,687,622
DATED : August 18, 1987
INVENTOR(S) : Larry L. Longden

It is certified that error appears in the above-identified patent and that said Letters Patent is hereby corrected as shown below:

Column 1, line 5, change "even" to --event--.
Column 6, line 30, change "curcuit" to --circuit--.
Column 6, line 41, change "andor" to --and/or--.
Column 7, line 24, delete third occurrence "and".
Column 8, line 65, change "$C_T$connected" to --$C_T$ connected--.
Column 9, line 6, change "lists" to --list--.
Column 9, line 13, change "8634$\Omega$" to --8364$\Omega$--.
Column 9, line 27, change "R11,15" to --R11,R15--.
Column 9, line 38, change "Johnason" to --Johanson--.
Column 9, line 44, after "Q2-Q5" insert a comma.
Column 9, line 45, change "Q2" to --Q12--.
Column 10, line 68, change "circults" to --circuits--.
Column 12, line 5, change "+5v" to --+5V--.
Column 12, line 39, change "FLAG 0 RESET" to --FLAG RESET--.
Column 15, line 68, change "NAND4" to --NAND 4--.
Column 18, line 35, change "eletrical" to --electrical--.

UNITED STATES PATENT AND TRADEMARK OFFICE
CERTIFICATE OF CORRECTION

PATENT NO. : 4,687,622

DATED : August 18, 1987

INVENTOR(S) : Larry L. Longden

It is certified that error appears in the above-identified patent and that said Letters Patent is hereby corrected as shown below:

Column 18, line 36, change the comma to a semicolon.

Column 19, line 11, change "Pulse" to --pulse--.

Column 19, line 13, delete second occurrence "sensor".

Signed and Sealed this

Nineteenth Day of January, 1988

Attest:

DONALD J. QUIGG

Attesting Officer

Commissioner of Patents and Trademarks